United States Patent
Reboh et al.

(10) Patent No.: US 11,469,137 B2
(45) Date of Patent: Oct. 11, 2022

(54) MANUFACTURING PROCESS OF AN RF-SOI TRAPPING LAYER SUBSTRATE RESULTING FROM A CRYSTALLINE TRANSFORMATION OF A BURIED LAYER

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Pablo Acosta Alba, Grenoble (FR); Emmanuel Augendre, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/124,184

(22) Filed: Dec. 16, 2020

(65) Prior Publication Data

US 2021/0183690 A1    Jun. 17, 2021

(30) Foreign Application Priority Data

Dec. 17, 2019  (FR) ..................................... 19 14563
Dec. 19, 2019  (FR) ..................................... 19 15019

(51) Int. Cl.
*H01L 21/762* (2006.01)
*H01L 21/763* (2006.01)
(Continued)

(52) U.S. Cl.
CPC ...... *H01L 21/76251* (2013.01); *H01L 21/763* (2013.01); *H01L 23/66* (2013.01); *H01L 27/1203* (2013.01)

(58) Field of Classification Search
CPC . H01L 21/02694; H01L 21/763; H01L 23/66; H01L 27/1203; H01L 21/76251
See application file for complete search history.

(56) References Cited

U.S. PATENT DOCUMENTS 9,246,006 B2   1/2016  Batude et al.
9,343,375 B2   5/2016  Batude et al.
(Continued)

FOREIGN PATENT DOCUMENTS

FR    3 067 517 A1    12/2018
JP    2019129195 A  *  8/2019
(Continued)

OTHER PUBLICATIONS

JP-2019129195-A english translation.*
(Continued)

*Primary Examiner* — Latanya N Crawford Eason
(74) *Attorney, Agent, or Firm* — Oblon, McClelland, Maier & Neustadt, L.L.P.

(57) ABSTRACT

A method for manufacturing a semiconductor-on-insulator type substrate for radiofrequency applications is provided, including the steps of: directly bonding a support substrate of a single crystal material and a donor substrate including a thin layer of a semiconductor material, one or more layers of dielectric material being at a bonding interface thereof; transferring the thin layer onto the support substrate; and forming an electric charge trap region in the support substrate in contact with the one or more layers of the dielectric material present at the bonding interface, by transforming a buried zone of the support substrate into a polycrystal.

20 Claims, 4 Drawing Sheets

(51) Int. Cl.
*H01L 23/66* (2006.01)
*H01L 27/12* (2006.01)

(56) References Cited

U.S. PATENT DOCUMENTS

| | | | |
|---|---|---|---|
| 9,431,538 | B2 | 8/2016 | Reboh et al. |
| 9,502,558 | B2 | 11/2016 | Reboh et al. |
| 9,704,709 | B2 | 7/2017 | Augendre et al. |
| 9,761,607 | B2 | 9/2017 | Reboh et al. |
| 9,876,121 | B2 | 1/2018 | Barraud et al. |
| 9,899,217 | B2 | 2/2018 | Reboh et al. |
| 9,935,019 | B2 | 4/2018 | Reboh et al. |
| 9,966,453 | B2 | 5/2018 | Reboh et al. |
| 10,014,183 | B2 | 7/2018 | Reboh et al. |
| 10,115,590 | B2 | 10/2018 | Reboh et al. |
| 10,141,424 | B2 | 11/2018 | Coquand et al. |
| 10,147,818 | B2 | 12/2018 | Reboh et al. |
| 10,170,621 | B2 | 1/2019 | Reboh et al. |
| 10,205,021 | B1 | 2/2019 | Reboh |
| 10,217,842 | B2 | 2/2019 | Reboh et al. |
| 10,217,849 | B2 | 2/2019 | Barraud et al. |
| 10,263,077 | B1 | 4/2019 | Reboh et al. |
| 10,269,930 | B2 | 4/2019 | Reboh et al. |
| 10,347,721 | B2 | 7/2019 | Reboh et al. |
| 10,431,683 | B2 | 10/2019 | Reboh et al. |
| 10,600,786 | B2 | 3/2020 | Maitrejean et al. |
| 2007/0032040 | A1 | 2/2007 | Lederer |
| 2010/0084734 | A1 | 4/2010 | Momo et al. |
| 2017/0338143 | A1 | 11/2017 | Peidous et al. |
| 2018/0033681 | A1 | 2/2018 | Ishikawa et al. |
| 2018/0233400 | A1 * | 8/2018 | Wang ............... H01L 21/02381 |
| 2018/0277421 | A1 | 9/2018 | Peidous et al. |
| 2018/0358381 | A1 | 12/2018 | Lamy et al. |
| 2020/0161336 | A1 | 5/2020 | Lamy et al. |

FOREIGN PATENT DOCUMENTS

| | | |
|---|---|---|
| WO | WO 2005/031842 A2 | 4/2005 |
| WO | WO 2016/081313 A1 | 5/2016 |

OTHER PUBLICATIONS

U.S. Appl. No. 14/575,329, Dec. 18, 2014, 2015/0179474, Maitrejean, et al.
U.S. App. No. 15/852,648, filed Dec. 22, 2017, 2019/0198616 A1, Coquand, et al.
U.S. App. No. 16/535,367, filed Aug. 8, 2019, 2020/0058768 A1, Coquand, et al.
U.S. App. No. 16/580,396, filed Sep. 24, 2019, 2020/0098859 A1, Reboh, et al.
U.S. App. No. 16/590,557, filed Oct. 2, 2019, 2020/0111872 A1, Reboh, et al.
U.S. App. No. 16/709,993, filed Dec. 11, 2019, 2020/0194273 A1, Reboh, et al.
U.S. App. No. 16/812,530, filed Mar. 9, 2020, 2020/0212179 A1, Reboh, et al.
French Preliminary Search Report dated Aug. 27, 2020 in French Application 19 14563 filed on Dec. 17, 2019 (with English Translation of Categories of Cited Documents), 3 gages
V. Ranieri, et al., "Gettering of metals by voids in silicon", Journal of Applied Physics 78, 3727 (1995); https://doi.org/10.1063/1.359953, 10 pages.

* cited by examiner

MANUFACTURING PROCESS OF AN RF-SOI TRAPPING LAYER SUBSTRATE RESULTING FROM A CRYSTALLINE TRANSFORMATION OF A BURIED LAYER

TECHNICAL FIELD

The field of the invention is that of semiconductor-on-insulator type substrates for radiofrequency applications. The invention more particularly relates to a method for manufacturing a silicon-on-insulator type structure comprising an electric charge trap layer.

PRIOR ART

In cellular and Wi-Fi systems, the RF module ("Front End Module") is one of the most critical components. Acting as an interface between the antenna and the RF transceiver, the RF module comprises sensitive components such as an LNA ("Low Noise Amplifier") antenna amplifier, power amplifiers, antenna-tuning switches and a supply managing unit.

To take up design challenges such as insulating linear switches and optimising efficiency of power amplifiers, the industry has developed specific processes for each component of the RF module, thus resulting in creating multiple components and integrated circuits.

While new high speed standards, such as 4G and 5G mobile telephony, use up to 40 different frequency bands to increase data throughput, new network equipment requires additional RF circuits, which dramatically increases the size thereof. This raised complexity requires new processes capable of offering greater flexibility and better integration without compromising performance.

Within this context, RF-SOI ("Radio-Frequency Silicon On Insulator") substrates enable a high integration level while fully meeting the RF requirements. Thus, among substrates adapted to make RF components, there are known for example from WO 2005/031842 A2 high resistivity silicon-based substrates comprising a support substrate, an electric charge trap layer (called a trap rich layer), a dielectric layer disposed on the trap layer and an active layer of semiconductor disposed on the dielectric layer.

Today manufacturing an RF-SOI substrate relies on forming the electric charge trap layer by depositing polycrystalline silicon on the support substrate and transferring the active layer on the support substrate according to the Smart Cut™ method.

One difficulty is that by resorting to depositing polycrystalline silicon (or depositing polycrystalline silicon followed by depositing oxide or even depositing polycrystalline silicon followed by oxidising the polycrystalline silicon), surface grinding proves necessary in order to achieve a roughness level compatible with bonding of substrates. This grinding, generally made by chemical mechanical polishing, makes manufacturing RF-SOI substrates more complex and increases the cost thereof.

Besides, when bonding substrates is performed according to a so-called inverted method, i.e. with an oxide present on the support substrate bonded to a silicon surface of the donor substrate, a technical difficulty lies in obtaining a thermal oxide (being preferred to depositing an oxide due to its better electric characteristics), this difficulty being increased when it is attempted to have a thick oxide. This difficulty is related, on the one hand, to the different oxidation rates between Si grains having different orientations and sizes in poly-Si and, on the other hand, to the effect of grain boundaries which generate variations in thickness and inhomogeneity of the oxide.

DISCLOSURE OF THE INVENTION

The purpose of the invention is to provide a method for manufacturing an RF-SOI substrate which enables the abovementioned drawbacks to be dispensed with and in particular for obtaining a trap layer, sandwiched between a single crystal substrate and a thermal oxide having high surface quality for bonding.

To this end, the invention relates to a method for manufacturing a semiconductor-on-insulator type substrate for radiofrequency applications, comprising the steps of directly bonding a support substrate of a single crystal material and a donor substrate including a thin layer of a semiconductor material, one or more layers of dielectric material being at the interface; and of transferring said thin layer onto the support substrate.

The method comprises a step of forming an electric charge trap region in the support substrate in contact with a layer of dielectric material present at the interface by transforming a buried zone of the support substrate into a polycrystal.

Some preferred but not limiting aspects of this method are as follows:

said transforming comprises amorphising the buried zone of the support substrate followed by recrystallising the buried zone in polycrystalline form;

amorphising comprises ion implanting;

recrystallising in polycrystalline form comprises at least one laser annealing causing a polycristalline microstructure in the buried zone to be created;

recrystallising in polycrystalline form comprises a plurality of laser annealings successively recrystallising a decreasing thickness of the buried zone;

recrystallising in polycrystalline form comprises, after the at least one laser annealing, an additional heat treatment step or an additional laser annealing for promoting the development of the polycrystalline microstructure;

it comprises, before amorphising the buried zone of the support substrate, forming a layer of dielectric material on the surface of the support substrate;

forming a layer of dielectric material on the surface of the support substrate is performed by thermal oxidation;

amorphising the buried zone of the support substrate is performed in the buried zone of the substrate located directly under the dielectric material layer;

the donor substrate is covered with a layer of dielectric material;

amorphising the buried zone of the support substrate is performed after transferring the said thin layer onto the support substrate;

the at least one laser annealing is performed through a mask in order to form a localised polycrystalline zone forming the electrical charge trap region;

it comprises, after making the electrical charge trap region and before bonding the support substrate and donor substrate, a step of removing a surface layer of the support substrate;

it comprises, after making the electrical charge trap region and before bonding the support substrate and donor substrate, a step of oxidising a surface layer of the support substrate;

the oxidising step is preceded by a step of thickening the support substrate;

it comprises a step of forming pores in the buried zone of the support substrate or in a zone directly underlying said buried zone in the support substrate;

the step of forming pores in the buried zone of the support substrate is performed before recrystallising the buried zone;

the step of forming pores in is performed in a localised manner;

transferring comprises fracturing the donor substrate at an embrittlement plane created by ion implantation;

the buried zone of the support substrate is a full wafer layer.

The invention is also concerned with a semiconductor-on-insulator type substrate for radiofrequency applications, comprising the stack of a base of a single crystal semiconductor material, an electrical charge trap layer of polycrystalline semiconductor material, a dielectric layer directly in contact with the electrical charge trap layer and a thin layer of semiconductor material. The stack further comprises a porous layer between the base and the electrical charge trap layer.

BRIEF DESCRIPTION OF THE DRAWINGS

Further aspects, purposes, advantages and characteristics of the invention will better appear upon reading the following detailed description of preferred embodiments thereof, given by way of non-limiting example, and made with reference to the appended drawings in which.

DESCRIPTION OF THE EMBODIMENTS

Figure 1:
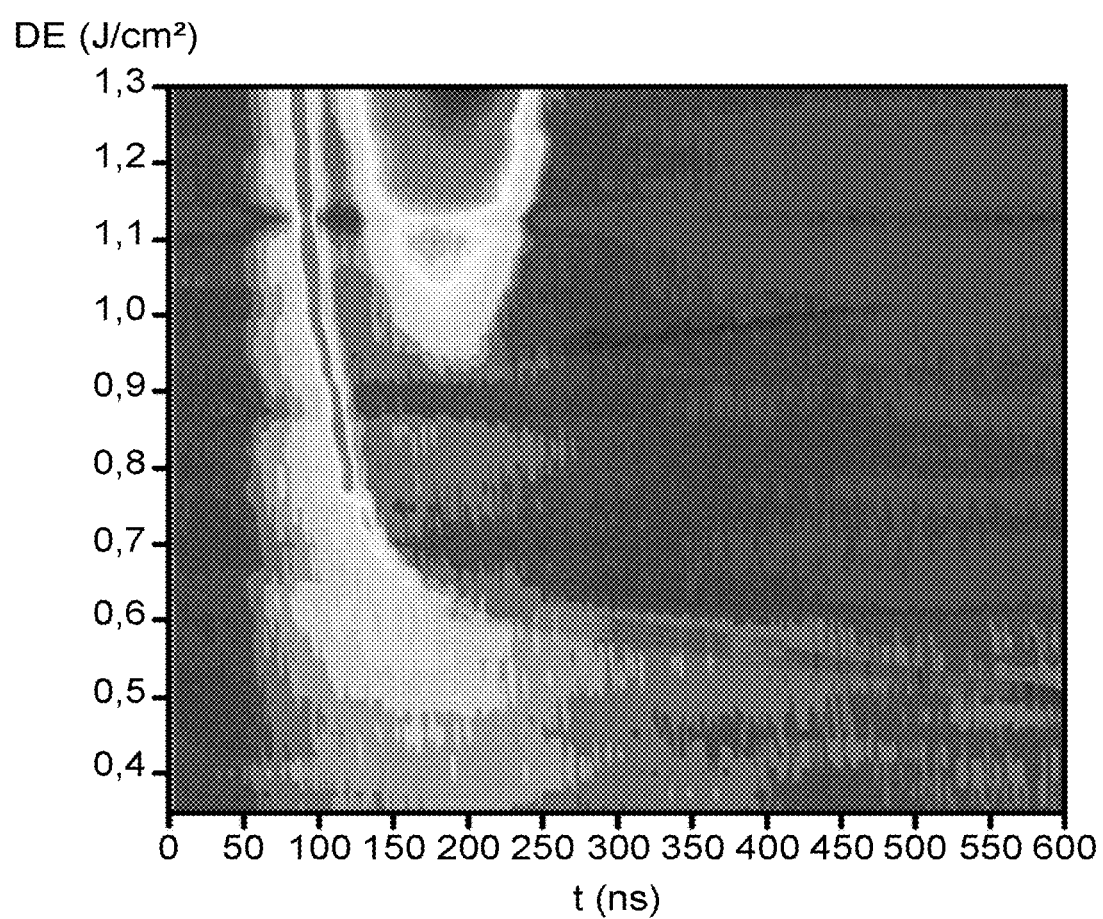
FIG. 1 represents the surface reflectivity of an amorphous Si layer as a function of the energy density of the laser beam used for recrystallising in polycrystalline form.

The invention is directed to a method for manufacturing a semiconductor-on-insulator type RF-SOI substrate for radiofrequency applications. This method comprises a step of bonding a support substrate of single crystal material and a donor substrate including a thin layer of a semiconductor material, one or more layers of dielectric material being at the interface.

This bonding step is followed by a step of transferring said thin layer on the support substrate. This transfer is performed according to a thin layer transfer technique based on molecular adhesion bonding (also called direct bonding). Among the thin layer transfer techniques, the following can be mentioned in particular:

the Smart Cut™ method according to which transferring comprises fracturing the donor substrate at an embrittlement plane coming from ion implantation. This method is more particularly based on implanting light hydrogen and/or helium ions into the donor substrate, assembling through direct bonding (i.e. without adding adhesive material at the bonding interface) this donor substrate with the support substrate and detaching a thin surface layer of the donor substrate through separation at the embrittlement plane defined by the ion implantation depth. Finishing steps, which may include high temperature heat treatments, finally impart the required crystalline and surface quality to the transferred layer.

the direct bonding and mechanical, chemical and/or mechanical-chemical thinning methods. These methods consist in assembling the donor substrate through molecular adhesion with the support substrate, and then thinning the donor substrate down to the desired thickness of active layer, for example through grinding and chemical mechanical polishing (CMP).

The support substrate is a substrate of a single crystal material. It can consist of materials usually used in microelectronics, optics, optoelectronics and photovoltaic industries. Especially, the support substrate can comprise at least one material selected from silicon, silicon-germanium and silicon carbide. The support substrate is typically a high resistivity substrate, namely with a resistivity typically greater than 1000 ohm·cm.

The method includes a step of forming an electrical charge trap region in the support substrate in contact with a layer of dielectric material present at the bonding interface, by transforming a buried zone of the support substrate into a polycrystal.

The electric charge trap region comprises a polycrystalline silicon type material, the defect density of which is favourable for trapping free electric charges able to develop in the support substrate.

The layer(s) of dielectric material present at the interface will make up the buried insulating layer of the RF-SOI substrate, this buried insulating layer electrically insulating the thin layer of the support substrate. This insulating layer typically comprises at least one of the materials from silicon dioxide, silicon nitride or aluminium oxide.

The RF-SOI substrate also comprises on the buried insulating layer, the thin layer transferred from the donor substrate. This thin layer corresponds to the active layer of the RF-SOI substrate in and/or on which RF components can be made. The thin layer can comprise at least one of the materials from silicon, silicon carbide or silicon-germanium.

Within the scope of the invention, the electric charge trap region is not formed by means of a deposition on the support substrate but through transforming a buried zone of the support substrate into a polycrystal. Such a transformation has the advantage of leaving the surface of the support substrate intact, ready for bonding.

Crystalline transformation can especially comprise amorphising the buried zone of the support substrate followed by recrystallising the buried zone in polycrystalline form.

Amorphising the buried zone can especially be performed by means of ion implantation through the front surface of the support substrate, for example one or more operations of implanting heavy ions selected from the following species: silicon, lithium, carbon, oxygen or fluorine or a combination of these species. These implantations may be performed simultaneously or successively, under identical or different conditions (particularly in terms of dose and energy). Oxygen and fluorine are advantageous because, in addition to amorphising the material, they make it possible to slow down the Solid Phase Epitaxial Regrowth or SPER which could lead to recrystallisation in single crystal form and to aid in nucleating the seeds with a view to polycrystalline recristallisation.

Recrystallising the buried zone in polycrystalline form can in turn be performed, or at least initiated, by means of a laser annealing which typically induces crystallisation according to a so-called explosive crystallisation state. To do so, the front surface of the support substrate is subjected to a laser irradiation, preferably pulsed irradiation, typically irradiation with a duration lower than one microsecond, typically of 200 nanoseconds, which initiates recrystallising the amorphised buried zone from its face arranged on the front surface side of the support substrate.

Optionally, this laser annealing can be followed by an additional heat treatment and/or one or more additional laser annealing operations promoting the development of the polycrystalline microstructure generated by the initial laser annealing. The additional heat treatment can typically range from 15 minutes at 500° C. to 2 s at 1100° C. It can be a rapid thermal annealing (commonly referred to as RTA) or flash annealing. The additional laser annealing operations (up to 100 annealing operations) are in turn performed in such a way that melting the material is not allowed.

The electrical charge trap region can form a continuous electrical charge trap layer extending over the entire wafer. For this, an amorphisation and a full wafer recrystallisation are performed.

The crystalline transformation to polycrystal may, however, only be performed in one or more localised zones of the support substrate, one or more other zones not being subjected to such a transformation. For this, the amorphisation can be performed only locally by localised implantation. A mask with openings allowing the species to be implanted to pass through can be used for this, the amorphised zones being thereby located at right angles with the openings of the mask. Alternatively the amorphization can be performed full wafer and the recrystallisation in polycrystalline form be localised. The recrystallisation laser annealing can be performed through a mask. Regions made polycrystalline are then obtained at the zone irradiated by the laser at right angles with of the openings the mask. Amorphous regions not irradiated by the laser can remain amorphous or be made single crystal regions by an adapted treatment, such as solid phase recrystallization annealing called SPER.

Forming the electrical charge trap zone can be performed before or after the transferring. Alternatively, amorphising can be performed before bonding and recrystallising into polycrystal after transferring.

In what follows, the example of forming a full wafer layer is taken, being reminded that the invention is not limited to this example.

Figure 2:
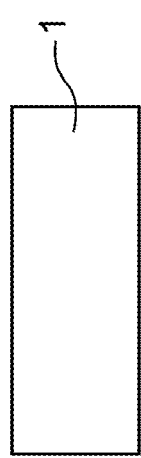
FIG. 2 illustrates a first embodiment of the method according to the invention with forming an electric charge trap layer buried under a dielectric layer.
Figure 2:
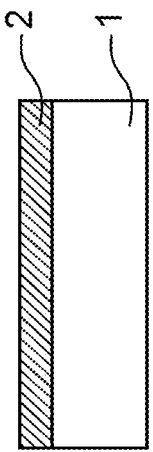
Figure 2:
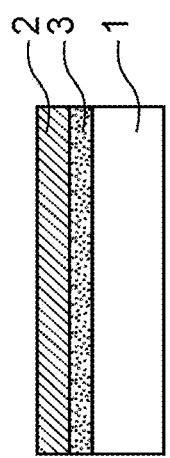
Figure 2:
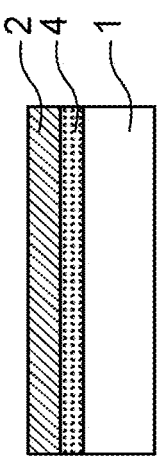
Figure 2:
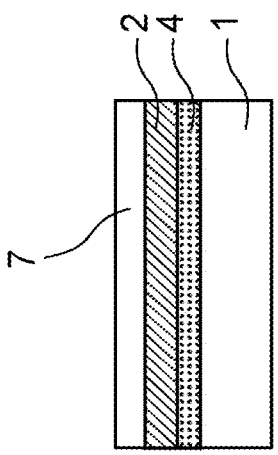
Figure 2:
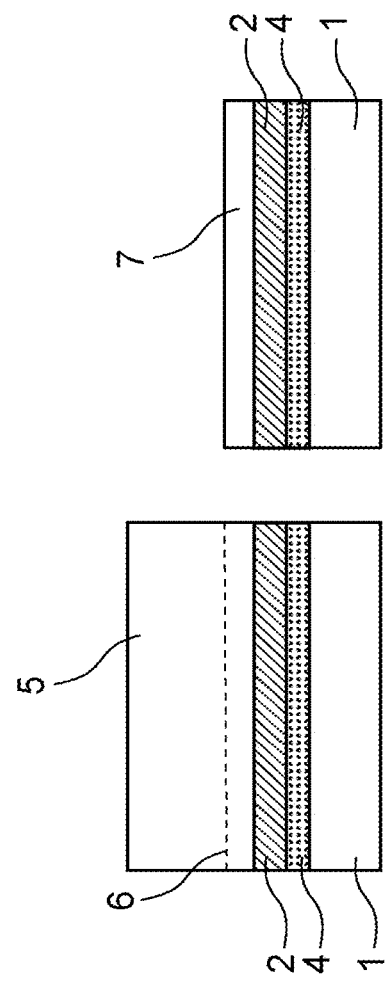

In a first embodiment of the invention illustrated in FIG. 2, the electric charge trap layer 4 is formed by polycrystalline transformation of a layer of the support substrate 1 buried under a dielectric layer 2. The manufacturing method starts with a step (S1) of providing the support substrate of a single crystal silicon and continues with a step (S2) of forming a layer 2 of dielectric material at the surface of the support substrate 1, for example based on thermally oxidising the support substrate over a thickness which can be between 5 nm and 400 nm. This oxidising is thus performed before forming the polysilicon layer and therefore does not have the aforesaid drawbacks of oxidising such a polysilicon layer.

The method continues with a step (S3) of amorphising an upper portion of the support substrate 1 through the layer 2 of dielectric material. This amorphising, by means of an ion implantation the energy of which is adapted to the thickness of the dielectric layer 2, will form a buried amorphous layer 3 directly under the dielectric material layer 2, that is without intermediate layer between the buried amorphous layer 3 and the layer 2 of dielectric material. The buried amorphous layer 3 can have a thickness between 5 nm and 200 nm for example. By way of example, implanting silicon ions with an energy of 20 keV and a dose of $2.5.10^{14}$ atoms/cm$^2$, respectively an energy of 40 keV and a dose of $2.5.10^{14}$ atoms/cm$^2$ or an energy of 150 keV and a dose of $4.25.10^{14}$ atoms/cm$^2$, into a substrate of a single crystal silicon enables a 30 nm thick amorphous layer buried at 10 nm under the surface of the substrate, respectively a 30 nm thick amorphous layer buried at 30 nm under the surface of the substrate or a 170 nm thick amorphous layer buried at 75 nm under the surface of the substrate, to be formed.

Heat treatment of the support substrate can then be performed in order to smooth the crystal/amorphous interface therein and thus promote subsequent recrystallisation of the buried amorphous layer. This smoothing heat treatment is performed at a sufficiently low temperature and for a sufficiently short time to avoid a too high recrystallisation of the amorphous layer. It can be performed for example at 500° C. for 1 to 5 min for silicon.

Laser annealing is applied during a step (S4) which transforms (or at least initiates such a transformation) the buried amorphous layer into a buried polycrystalline layer 4. This laser annealing can be performed at a wavelength between 200 nm and 400 nm with a relatively short (lower than one microsecond and ideally in the order of a few hundreds of nanoseconds) pulse duration. This laser annealing aims at inducing a crystallisation according to a so-called explosive crystallisation regime. Such a regime can especially be detected through observing the surface reflectivity. In this respect FIG. 1 illustrates an example of reflectivity of an amorphous Si layer as a function of the energy density DE (J/cm$^2$) of the laser beam used and of the duration t (ns) of laser irradiation. Initiating transformation of amorphous silicon is identified therein as the first significant reflectivity change, such as for example that identified with a laser pulse of 150 ns having an energy density of 0.65 J/cm$^2$. Such a detection can be employed to determine operating conditions appropriate for the buried zone to be recrystallised in polycrystalline form.

An additional heat treatment of the support substrate or additional laser annealing operations can then be performed, as previously explained, in order to promote developing the polycrystalline microstructure.

The method can also comprise a step of removing all or part of the dielectric layer 2, for instance by selective etching.

The method continues with a step (S5) of bonding the support substrate with a donor substrate 5 having an embrittlement plane 6 coming from helium and/or hydrogen implantation, the dielectric layer 2 being at the interface in this example. Separation annealing is then applied during a step (S6) which results in fracturing the donor substrate at the embrittlement plane and in transferring a thin layer 7 from the donor substrate to the support substrate. A surface finishing treatment can then be applied to the transferred thin layer 7.

Figure 3:
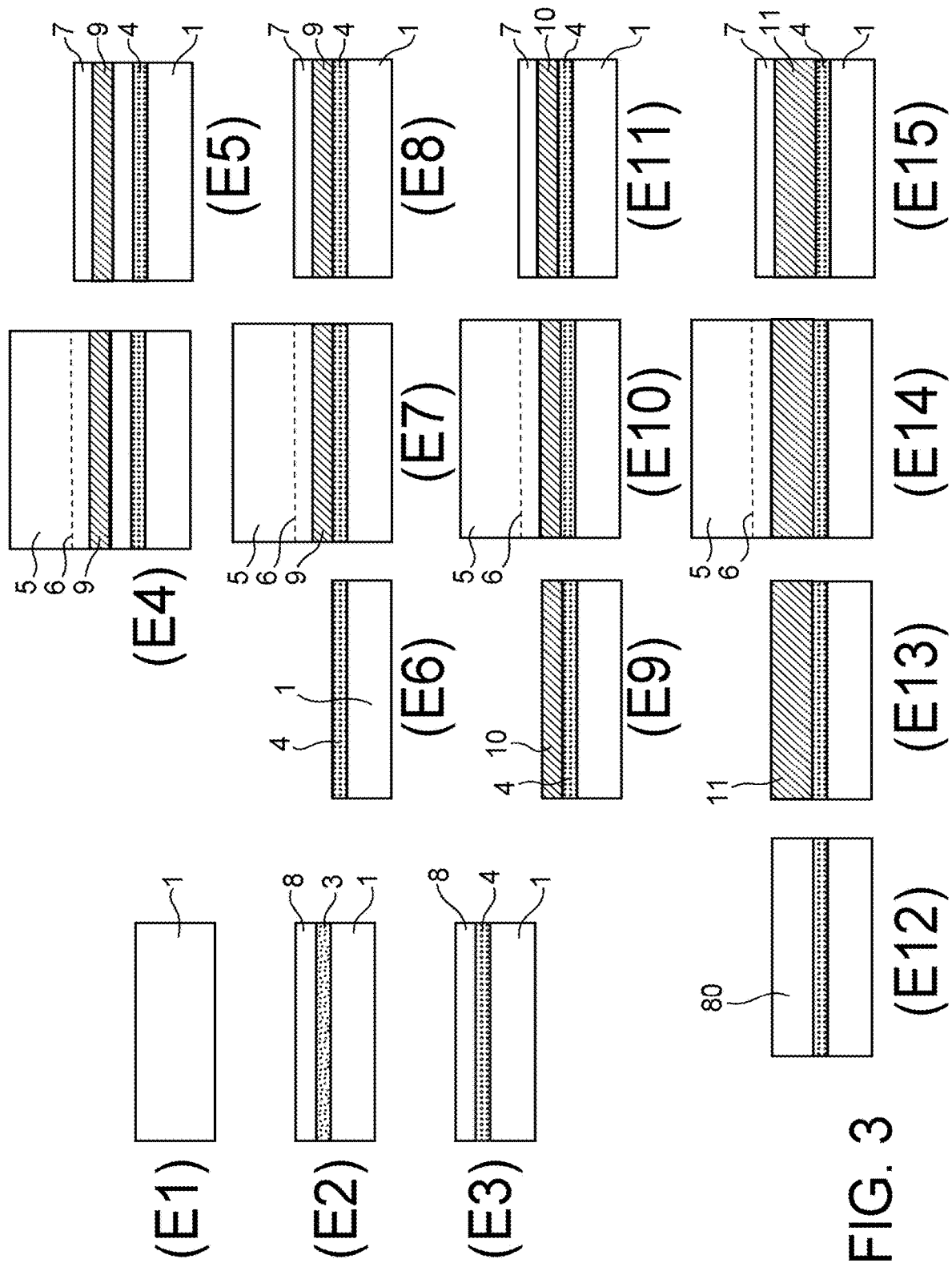
FIG. 3 illustrates a second embodiment of the method according to the invention with forming an electric charge trap layer buried under a surface of a semiconductor substrate.

In a second embodiment of the invention illustrated in FIG. 3, the electric charge trap layer 4 is formed by polycrystalline transformation of a layer of the support substrate 1 buried under the surface of the substrate. The manufacturing method starts with a step (E1) of providing the support substrate of a single crystal silicon and continues with a step (E2) of amorphising a buried layer of the support substrate by means of ion implantation such as previously described. This amorphising forms a buried amorphous layer 3 which separates a massive part of the support substrate from a single crystal surface layer 8.

Heat treating the support substrate can then optionally be performed in order to smooth the crystal/amorphous interfaces and thus promote subsequently recrystallising the buried amorphous layer.

Laser annealing is applied during a step (E3) which transforms (or at least initiates such a transformation) the buried amorphous layer into a buried polycrystalline layer 4. An additional heat treatment and/or additional laser annealing operations can optionally be then performed, as previously explained, in order to promote developing the polycrystalline microstructure.

In a first alternative, the method continues with a step (E4) of bonding the support substrate with a donor substrate 5 having an embrittlement plane 6 coming from helium and/or hydrogen implantation, the donor substrate 5 being covered with a dielectric layer 9, for example of silicon oxide. Separation annealing is then applied during a step (E5) which results in fracturing the donor substrate at the embrittlement plane and in transferring a thin layer 7 from the donor substrate to the support substrate. A surface finishing treatment can then be applied to the thin layer 7 transferred.

In a second alternative, the method continues after step (E3) with a step (E6) of removing the single crystal surface layer 8, for example through oxidising followed with selectively etching the oxide created, and then with steps of bonding (E7) and separating (E8) similar to steps (E4) and (E5).

In a third alternative, the method continues after step (E3) with a step (E9) of oxidising all or part of the single crystal surface layer 8 to form an oxide layer 10 and then with a step (E10) of bonding with a donor substrate 5 having an embrittlement plane. This donor substrate may or may not include a surface layer to favour bonding (for example a dielectric layer which can be of silicon oxide). Separation annealing is then applied during a step (E11) which results in fracturing the donor substrate at the embrittlement plane and in transferring a thin layer 7 from the donor substrate to the support substrate.

In a fourth alternative, the method continues after step (E3) with a step (E12) of thickening the support substrate resulting, for example by means of epitaxy, in a thickened single crystal surface layer 80. The method continues with a step (E11) of oxidising all or part of the thickened single crystal surface layer to form an oxide layer 11 and then with a step (E10) of bonding with a donor substrate 5 which may or may not include a surface layer to favour bonding (for example a dielectric layer which can be of silicon oxide) and having an embrittlement plane 6 and a step (E11) of fracturing the donor substrate at the embrittlement plane resulting in transferring a thin layer 7 from the donor substrate to the support substrate. This alternative makes it possible to meet good quality thick oxide requirements, with for example a layer 11 having a thickness greater than 400 nm.

In the different alternatives, when the single crystal surface layer 8, being possibly thickened 80 is oxidised, oxidising combined with cleaning enables the thickness of the single crystal surface layer 8 to be reduced and/or surface contaminants which would have been introduced by amorphising ion implantation, to be removed.

Figure 4:
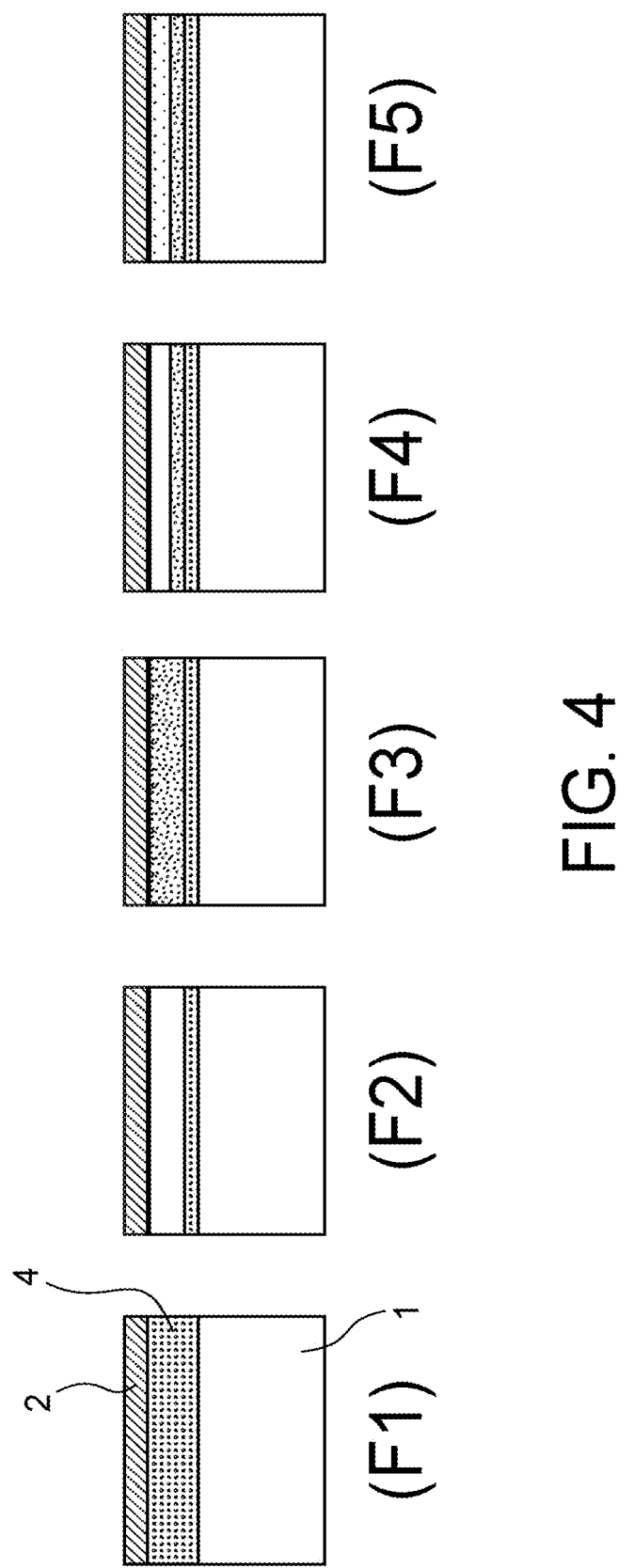
FIG. 4 illustrates an alternative embodiment by means of which the electric charge trap region takes the form of a multilayer structure the interest of which is a reduced grain size and extended grain boundaries for recombining carriers.

In a third embodiment represented in FIG. 4, recrystallising the buried layer in polycrystalline form comprises a plurality of laser annealing operations which successively recrystallise a decreasing thickness of the buried zone from the interface with the dielectric layer 2. By starting during a step (F1) with a structure comprising a buried layer 4 covered with an oxide layer 2 and made polycrystalline by a first laser annealing, this embodiment for example comprises applying (F2) a second laser annealing which melts the buried layer 4 over a thickness d2 lower than the thickness of layer 4. This second laser annealing results (F3) in forming a buried layer 4 in the form of a two-layer polycrystalline structure. A third laser annealing (F4) which melts the buried layer 4 over a thickness d3 lower than d2 can then be performed, which results (F5) in a buried layer 4 in the form of a three-layer polycrystalline structure. One or more additional heat treatments can optionally be performed after these different laser annealing operations or between one or more of them, in order to promote the development of the polycrystalline microstructure. For the same purpose, one or more additional laser annealing operations that do not allow the material to melt can be performed.

In a fourth embodiment, amorphisation is performed full wafer, before or after transferring the thin layer 7 from the donor substrate to the support substrate, and recrystallising the buried layer 4 in polycrystalline form takes place after this transfer. In this case, the temperature during the transfer (and especially during bonding enhancement annealing and separation annealing) is limited to a temperature below 500° C. It is thereby possible to carry out laser recrystallization annealing through a mask to form localized polycrystalline zones as already discussed. Other regions not irradiated by the laser can in turn be made single crystal regions by an adapted treatment, for example by solid phase recrystallization annealing called SPER. Alternatively, it is possible to perform amorphisation locally before or after transfer and recrystallisation in polycrystalline full-wafer form or locally at the locally amorphised zones.

In a fifth embodiment, pores are created in the amorphous zone or in the buried zone of the substrate to be amorphised. These pores can be created over the entire thickness of this zone or at least over a part of this zone, preferably the most buried part of the amorphous or to-be-amorphised zone (in contact with or near the single crystal part of the substrate). It is possible to create these pores also in the single crystal zone of the substrate directly below the amorphous zone or the buried zone of the substrate to be amorphised.

These pores can be created before or after forming the polycrystalline trap layer. They are used to stabilise this layer once it has been formed during the subsequent heat treatment at high temperature, for example above 1000° C., which can take place in particular during the manufacture of the SOI substrate or components made on this substrate, by limiting growth of the grains formed and transmission of the crystalline structure from the single crystal part of the substrate to the trap layer.

When these pores are created prior to recrystallisation, they will also allow the recrystallisation in polycrystalline form to be enhanced during this recrystallisation by also limiting the propagation of recrystallisation fronts coming from the single crystal part of the substrate.

These pores can be in the form of cavities and/or bubbles. They can be obtained by implanting gaseous species, such as hydrogen or noble gases, including helium or neon, alone or in combination, simultaneously or sequentially. Such implantation allows the buried zone to be enriched with gas to form pores. A heat treatment can then be performed in order to make these pores mature and/or allow discharge of all or part of the gaseous species present in these pores. The implantation and heat treatment conditions are chosen so that they do not cause delamination at the buried zone.

For further details on this step, reference may be made to the article by V. Ranieri et al. entitled "Gettering of metals by voids in silicon", Journal of Applied Physics 78, 3727 (1995); https://doi.org/10.1063/1.359953 and to the application FR19/15019, the priority of which is claimed in the present application and the contents of which form an integral part of the present description.

These pores can be made full wafer or locally by implantation through a mask. If they are localised, they are advantageously placed in zones at right angles with localised polycrystalline zones. They can be created before or after the amorphisation step, before or after the formation of the dielectric layer 2 if there is one.

The porous zone can also be formed electrochemically upon making the substrate.

The result is an RF-SOI substrate comprising, in stacked order, a base of single crystal semiconductor material, an electrical charge trap layer of polycrystalline semiconductor material, a dielectric layer directly in contact with the trap layer and an active layer. Advantageously, the semiconductor material of the trap layer is the same as that of the base. This RF-SOI substrate also includes a porous layer between the base and the trap layer. This porous layer consists of a solid backbone and a distribution of empty and/or gas-filled pores.

At least part of the backbone of the porous layer may be single crystal. This is the case when the porous layer is made underneath the amorphous or to-be-amorphised layer or when amorphisation only takes place on part of the porous or to-be-porosified layer.

At least part of the backbone of the porous layer may be polycrystalline. This is the case when amorphisation takes place on at least part of the porous or to-be-porosified layer. It is possible that the entire trap layer is porous.

The electrical charge trap layer can be localised forming polycrystalline trap zones in the plane of the substrate or where at least part of the backbone is polycrystalline when they are at least partly porous.

Zones adjacent to these trap zones in the plane of the substrate are thereby advantageously single crystal zones.

The invention claimed is:

1. A method for manufacturing a semiconductor-on-insulator type substrate for radiofrequency applications, comprising the steps of:
    directly bonding a support substrate of a single crystal material and a donor substrate including a thin layer of a semiconductor material, one or more layers of dielectric material being at a bonding interface thereof;
    transferring the thin layer onto the support substrate; and
    forming an electric charge trap region in the support substrate in contact with the one or more layers of the dielectric material present at the bonding interface, by transforming a buried zone of the support substrate into a polycrystal,
    wherein the transforming comprises amorphizing the buried zone of the support substrate followed by recrystallizing the buried zone into polycrystalline form.

2. The method according to claim 1, wherein the amorphizing comprises ion implanting.

3. The method according to claim 1, wherein the recrystallizing comprises at least one laser annealing operation causing a polycrystalline microstructure to be created in the buried zone.

4. The method according to claim 3, wherein the recrystallizing further comprises a plurality of laser annealing operations successively recrystallizing a decreasing thickness of the buried zone.

5. The method according to claim 3, wherein the recrystallizing further comprises, after the at least one laser annealing operation, an additional heat treatment step or an additional laser annealing operation promoting development of a polycrystalline microstructure.

6. The method according to claim 1, further comprising, before the amorphizing, forming a layer of dielectric material at a surface of the support substrate.

7. The method according to claim 6, wherein the forming of the layer of the dielectric material at the surface of the support substrate is performed by thermal oxidation.

8. The method according to claim 6, wherein the amorphizing is performed in the buried zone of the support substrate located directly under the layer of the dielectric material.

9. The method according to claim 1, wherein the donor substrate is covered with a layer of dielectric material.

10. The method according to claim 3, wherein the amorphizing is performed after the transferring of the thin layer onto the support substrate.

11. The method according to claim 3, wherein the at least one laser annealing operation is performed through a mask in order to form a localized polycrystalline zone forming the electric charge trap region.

12. The method according to claim 9, further comprising, after the forming of the electric charge trap region and before the directly bonding of the substrate support and the donor substrate, a step of removing a surface layer from the substrate support.

13. The method according to claim 3, further comprising, after the forming of the electric charge trap region and before the directly bonding of the substrate support and the donor substrate, a step of oxidizing a surface layer of the substrate support.

14. The method according to claim 12, wherein the oxidizing step is preceded by a step of thickening the support substrate.

15. The method according to claim 1, further comprising a step of forming pores in the buried zone of the support substrate or in a zone directly underlying the buried zone in the support substrate.

16. The method according to claim 15, wherein the step of the forming of the pores in the buried zone of the support substrate is performed before the recrystallizing of the buried zone into polycrystalline form.

17. The method according to claim 15, wherein the step of the forming of the pores in the buried zone is performed locally.

18. The method according to claim 1, wherein the buried zone of the support substrate is a full wafer layer.

19. A semiconductor-on-insulator type substrate for radiofrequency applications, the semiconductor-on-insulator type substrate comprising:
    a stack of a base of a single crystal semiconductor material;
    an electrical charge trap layer of polycrystalline semiconductor material;
    a dielectric layer directly in contact with the electrical charge trap layer and a thin layer of semiconductor material; and
    a porous layer made of semiconductor material between the base and the electrical charge trap layer.

20. The semiconductor-on-insulator type substrate according to claim 19, wherein the semiconductor material of the porous layer is a same semiconductor material as the polycrystalline semiconductor material of the electrical charge trap layer.

* * * * *